(12) United States Patent
Hasegawa et al.

(10) Patent No.: US 8,169,286 B2
(45) Date of Patent: May 1, 2012

(54) COIL UNIT, METHOD OF MANUFACTURING THE SAME, AND ELECTRONIC INSTRUMENT

(75) Inventors: Minoru Hasegawa, Suwa (JP); Masao Kuroda, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 241 days.

(21) Appl. No.: 12/071,256

(22) Filed: Feb. 19, 2008

(65) Prior Publication Data

US 2008/0197960 A1 Aug. 21, 2008

(30) Foreign Application Priority Data

Feb. 20, 2007 (JP) ................ 2007-039887

(51) Int. Cl.
- H01F 5/00 (2006.01)
- H01F 27/28 (2006.01)
- H01F 27/02 (2006.01)

(52) U.S. Cl. ............... 336/200; 336/90; 336/232
(58) Field of Classification Search .......... 336/90, 336/200, 232, 233
See application file for complete search history.

(56) References Cited

U.S. PATENT DOCUMENTS

| | | | | |
|---|---|---|---|---|
| 4,777,436 | A * | 10/1988 | Fiori, Jr. | 324/207.17 |
| 6,380,834 | B1 * | 4/2002 | Canzano et al. | 336/200 |
| 6,412,702 | B1 * | 7/2002 | Ishikawa et al. | 235/492 |
| 6,593,841 | B1 * | 7/2003 | Mizoguchi et al. | 336/200 |
| 2003/0020583 | A1 * | 1/2003 | Hui et al. | 336/200 |
| 2004/0266486 | A1 | 12/2004 | Deguchi et al. | |
| 2005/0270745 | A1 * | 12/2005 | Chen et al. | 361/707 |
| 2007/0030659 | A1 * | 2/2007 | Suzuki et al. | 336/200 |

FOREIGN PATENT DOCUMENTS

| | | |
|---|---|---|
| JP | U-1-156073 | 10/1989 |
| JP | U-3-90371 | 9/1991 |
| JP | A-4-122007 | 4/1992 |
| JP | 05135968 A * | 6/1993 |
| JP | 07254765 A * | 10/1995 |
| JP | A-7-263264 | 10/1995 |
| JP | Y-7-51343 | 11/1995 |
| JP | A-08-079976 | 3/1996 |
| JP | A-8-148359 | 6/1996 |
| JP | A 8-148360 | 6/1996 |
| JP | 08175085 A * | 7/1996 |
| JP | A-8-316040 | 11/1996 |
| JP | A-9-36454 | 2/1997 |
| JP | A-10-097932 | 4/1998 |
| JP | A-11-16756 | 1/1999 |
| JP | A-11-332135 | 11/1999 |
| JP | 2000269059 A * | 9/2000 |
| JP | A-2000-269059 | 9/2000 |
| JP | A-2002-75737 | 3/2002 |
| JP | 2003272938 A * | 9/2003 |
| JP | A-2003-272938 | 9/2003 |
| JP | A 2005-26743 | 1/2005 |
| JP | A 2005-260122 | 9/2005 |
| JP | A-2006-303382 | 11/2006 |

* cited by examiner

Primary Examiner — Elvin G Enad
Assistant Examiner — Tsz Chan
(74) Attorney, Agent, or Firm — Oliff & Berridge, PLC

(57) ABSTRACT

A coil unit includes a planar coil, a printed circuit board that includes a planar coil placement section that receives the planar coil, a protective sheet that is provided on a transmission side of the planar coil and protects the planar coil, and a magnetic sheet that is provided on a non-transmission side of the planar coil. The planar coil is placed in the planar coil placement section and is electrically connected to the printed circuit board. The planar coil placement section has a shape that corresponds to an external shape of the planar coil.

7 Claims, 9 Drawing Sheets

COIL UNIT, METHOD OF MANUFACTURING THE SAME, AND ELECTRONIC INSTRUMENT

Japanese Patent Application No. 2007-39887 filed on Feb. 20, 2007, is hereby incorporated by reference in its entirety.

BACKGROUND OF THE INVENTION

The present invention relates to a coil unit relating to non-contact power transmission using a coil, a method of manufacturing the same, an electronic instrument, and the like.

Non-contact power transmission has been known which enables power transmission without metal-to-metal contact utilizing electromagnetic induction. As application examples of non-contact power transmission, charging a portable telephone, a household appliance (e.g., telephone handset), and the like has been proposed.

In recent years, a reduction in size of portable telephones has been increasingly desired. This makes it necessary to reduce the size (particularly thickness) of a power transmission coil unit. JP-A-8-148360, JP-A-2005-26743, and JP-A-2005-260122 disclose technologies relating to a reduction in size of a coil unit.

JP-A-8-148360 discloses technology in which the thickness of a coil of a non-contact power transmission module is reduced using a soft magnetic sheet instead of ferrite. This technology is useful for reducing the thickness of a magnetic material. On the other hand, the thickness of the remaining portion of the coil unit cannot be reduced to a large extent using this technology.

JP-A-2005-26743 discloses technology which reduces the thickness of a coil unit by employing a structure which is affected to only a small extent by a surrounding metal under a use environment of a non-contact IC card. Specifically, a non-contact IC card is stably written/read without being affected by a surrounding metal by disposing two metal sheets on the back side of an antenna and a magnetic material and tuning the antenna. However, the metal sheet produces heat when applying this technology to non-contact power transmission. Moreover, since it is necessary to tune each antenna, mass productivity deteriorates due to an increase in cost.

JP-A-2005-260122 discloses technology which reduces the size of a non-contact power transmission module by forming the non-contact power transmission module using a flexible printed circuit (FPC) board. JP-A-2005-260112 discloses technology in which a coil section and a circuit section are formed so that a flexible printed circuit board can be folded at an intermediate point between the coil section and the circuit section, and the flexible printed circuit board is mounted by folding the flexible printed circuit board to sandwich a pot-type core. This technology is useful when using a ferrite material as the material for the core. However, the coil placement shape cannot be formed when using a sheet-shaped magnetic material. Moreover, it is difficult to apply this technology when using a wound coil and a substrate.

SUMMARY

According to one aspect of the invention, there is provided a coil unit comprising:

a planar coil having a transmission side and a non-transmission side;

a printed circuit board that includes a planar coil placement section that receives the planar coil;

a protective sheet that is provided on the transmission side of the planar coil and protects the planar coil; and a magnetic sheet that is provided on the non-transmission side of the planar coil, the planar coil being placed in the planar coil placement section and electrically connected to the printed circuit board; and the planar coil placement section having a shape that corresponds to an external shape of the planar coil.

According to another aspect of the invention, there is provided an electronic instrument comprising the above coil unit.

According to another aspect of the invention, there is provided a method of manufacturing a coil unit that includes a planar coil, the method comprising:

(A) placing a protective sheet on an assembly jig;
(B) placing a printed circuit board on the protective sheet, the printed circuit board having a planar coil placement section that has a shape corresponding to an external shape of the planar coil;
(C) placing the planar coil in the planar coil placement section; and
(D) placing a magnetic sheet on the printed circuit board and the planar coil.

DETAILED DESCRIPTION OF THE EMBODIMENT

Figure 1:
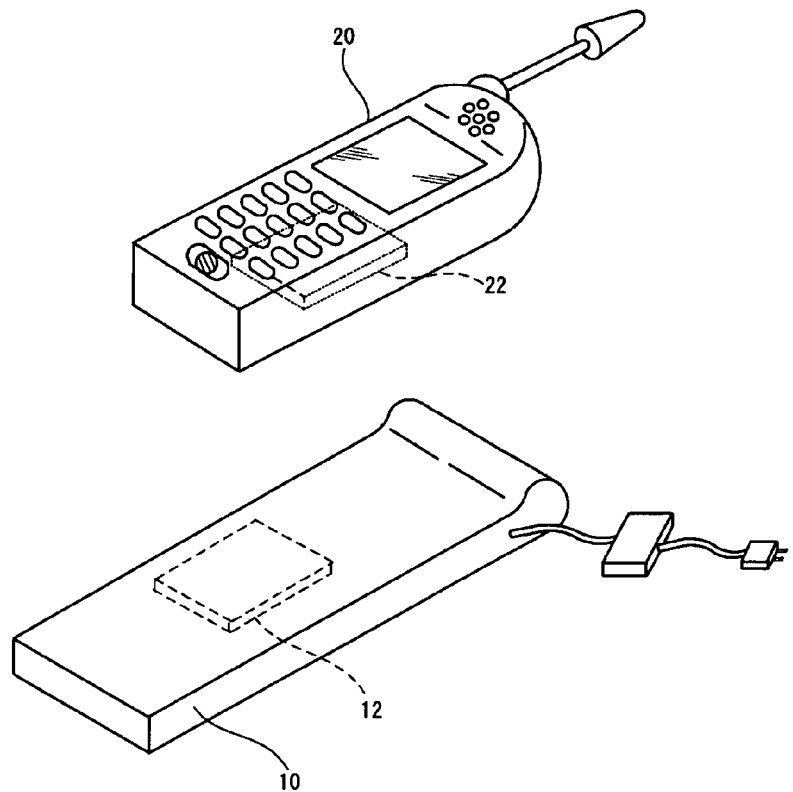
FIG. 1 is a view schematically showing a charger and an electronic instrument (e.g., portable telephone) which is charged using the charger.

Some aspects of the invention may provide a coil unit of which the thickness can be reduced, a method of manufacturing the same, and an electronic instrument.

According to one embodiment of the invention, there is provided a coil unit comprising:

a planar coil having a transmission side and a non-transmission side;

a printed circuit board that includes a planar coil placement section that receives the planar coil;

a protective sheet that is provided on the transmission side of the planar coil and protects the planar coil; and a magnetic sheet that is provided on the non-transmission side of the planar coil, the planar coil being placed in the planar coil placement section and electrically connected to the printed circuit board; and the planar coil placement section having a shape that corresponds to an external shape of the planar coil.

According to this configuration, since the planar coil is placed in the planar coil placement section of the printed circuit board, the thickness of the coil unit can be reduced by the thickness of the planar coil placed in the planar coil placement section. According to this configuration, the transmission side of the planar coil and its peripheral surface can be easily made flush. Moreover, since the planar coil can be positioned with respect to the printed circuit board by merely placing the planar coil in the planar coil placement section, positioning is facilitated.

In the coil unit, the planar coil may have an air-core section; and an inner terminal of the planar coil may have a coil inner terminal lead line that is provided over the non-transmission side of the planar coil.

When the coil inner terminal lead line is provided over the transmission side, elevations or depressions occur on the transmission side. According to this aspect, the transmission side can be made flush while increasing transmission efficiency.

In the coil unit, the protective sheet may have a first positioning hole that is formed at a position corresponding to the air-core section of the planar coil.

Since the protective sheet has the first positioning hole at a position corresponding to the air-core section of the planar coil, it becomes easy to position the planar coil with respect to the protective sheet.

In the coil unit, the protective sheet may be a heat sink sheet that has a thermal conductivity of 1 W/mK or more.

It is important to suppress heat generation during non-contact power transmission. In particular, it is important to dissipate heat generated from the coil. When the protective sheet is a heat sink sheet having a thermal conductivity equal to or higher than 1 W/mK (i.e., thermal conductivity of glass), heat generated from the coil can be dissipated through the protective sheet (heat sink sheet) adhering to the coil. In particular, since the transmission side adheres to an external casing of a product, it is possible to reduce the thermal resistance of a heat sink path connected to the external casing through the protective sheet (heat sink sheet) which adheres to the transmission side of the coil. On the other hand, since components (e.g., battery and crystal) affected by an increase in temperature are provided on the non-transmission side, the main heat sink path is provided on the transmission side.

Since the inner terminal of the planar coil is withdrawn over the non-transmission side, the transmission side can be made flush. This increases the adhesion between the planar coil and the protective sheet (heat sink sheet) to reduce contact thermal resistance, whereby heat is easily dissipated.

In the coil unit, the printed circuit board may have a lead line placement section that receives a lead line of each terminals of the planar coil; and the lead line placement section may be continuous with the planar coil placement section.

The lead lines are relatively gently bent and then run onto the wiring circuit board due to the presence of the lead line placement section. Moreover, the thickness of the coil unit can be reduced near the planar coil by the thickness of the lead lines.

In the coil unit, the printed circuit board may have a second positioning hole; and the protective sheet may have a third positioning hole that is formed at a position corresponding to the second positioning hole.

Since the protective sheet has the third positioning hole at a position corresponding to the second positioning hole in the printed circuit board, the printed circuit board can be easily positioned with respect to the protective sheet.

In the coil unit, a mounted circuit may be provided on a non-transmission side of the printed circuit board. Since the mounted circuit is provided on the non-transmission side, elevations or depressions do not occur on the transmission side.

In the coil unit, a common ground electrode surface may be formed on a transmission side of the printed circuit board, the common ground electrode surface being electrically connected to the mounted circuit. A large ground area can be provided while effectively utilizing the space on the transmission side of the printed circuit board by providing the common ground electrode on the transmission side, whereby the ground potential can be stabilized. Moreover, the transmission side of the printed circuit board can be made flat by providing the ground electrode surface on the transmission side. The transmission side of the printed circuit board and a ground electrode on the non-transmission side may be electrically connected via a through-hole.

According to another embodiment of the invention, there is provided an electronic instrument comprising one of the above coil units. Since this electronic instrument has a configuration in which the thickness and size of the coil unit can be easily reduced, the size of the electronic instrument can also be easily reduced. Moreover, since the planar coil is provided in the coil unit, the planar coil can be easily incorporated in the electronic instrument.

According to another embodiment of the invention, there is provided a method of manufacturing a coil unit that includes a planar coil, the method comprising:

(A) placing a protective sheet on an assembly jig;

(B) placing a printed circuit board on the protective sheet, the printed circuit board having a planar coil placement section that has a shape corresponding to an external shape of the planar coil;

(C) placing the planar coil in the planar coil placement section; and (D) placing a magnetic sheet on the printed circuit board and the planar coil.

According to this configuration, since the elements of the coil unit are sequentially stacked using the assembly jig and the planar coil is placed in the planar coil placement section formed in the printed circuit board, the coil unit can be easily manufactured.

This method may further include electrically connecting a lead line of each terminals of the coil to a wire layer of the printed circuit board between the steps (C) and (D) or after the step (D).

In the method, the planar coil may be an air-core planar coil;

the protective sheet may have a first positioning hole that is formed at a position corresponding to an air-core section of the planar coil;

the assembly jig may have a first positioning protrusion;

the step (A) may include inserting the first positioning protrusion into the first positioning hole to position the protective sheet; and the step (C) may include inserting the first positioning protrusion into the air-core section to position the planar coil.

According to this configuration, since the protective sheet and the planar coil are positioned by inserting the first positioning protrusion of the assembly jig into the positioning holes of the protective sheet and the planar coil, positioning is facilitated.

In the method, a lead line of an inner terminal of the planar coil may be provided on a side opposite to a side where the planar coil contacts with the protective sheet. According to this configuration, a coil unit having a reduced thickness can be manufactured.

In the method, the first positioning protrusion may be held on the assembly jig so that the first positioning protrusion can adjust a height of the first positioning protrusion. According to this configuration, the protective sheet, the printed circuit board, and the planar coil can be easily positioned during mounting by causing the first positioning protrusion to have a sufficient height, and the first positioning protrusion can be caused to descend by bonding the protective sheet. This improves assembling properties.

In the method, the printed circuit board may have a second positioning hole;

the protective sheet may have a third positioning hole that is formed at a position corresponding to the second positioning hole;

the assembly jig may have a second positioning protrusion;

the step (B) may include inserting the second positioning protrusion into the second positioning hole to position the printed circuit board; and the step (C) may include inserting the second positioning protrusion into the third positioning hole to position the protective sheet.

According to this configuration, since the protective sheet and the printed circuit board are positioned by inserting the second positioning protrusion of the assembly jig into the positioning holes of the protective sheet and the printed circuit board, positioning is facilitated.

Preferred embodiments of the invention are described in detail below. Note that the embodiments described below do not in any way limit the scope of the invention defined by the claims laid out herein. Note that all elements of the embodiments described below should not necessarily be taken as essential requirements for the invention.

1. Charging System

FIG. 1 is a view schematically showing a charger 10 and an electronic instrument (e.g., portable telephone 20) which is charged using the charger 10. FIG. 1 shows the portable telephone 20 which is horizontally placed on the charger 10. The portable telephone 20 is charged using the charger 10 by non-contact power transmission utilizing electromagnetic induction which occurs between a coil of a coil unit 12 of the charger 10 and a coil of a coil unit 22 of the portable telephone 20.

Each of the charger 10 and the portable telephone 20 may have a positioning structure. For example, the charger 10 may have a positioning protrusion which protrudes outward from the outer surface of its housing, and the portable telephone 20 may have a positioning depression which is formed along the outer surface of its housing. This allows the coil unit 22 of the portable telephone 20 to be disposed at a position at which the coil unit 22 faces the coil unit 12 of the charger 10.

2. Coil Unit

Figure 2:
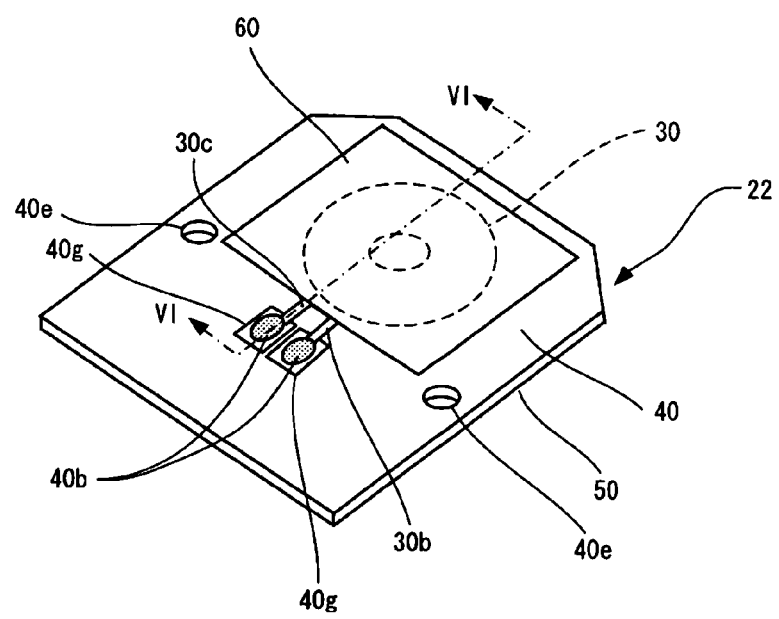
FIG. 2 is a view schematically showing a coil unit.
Figure 3:
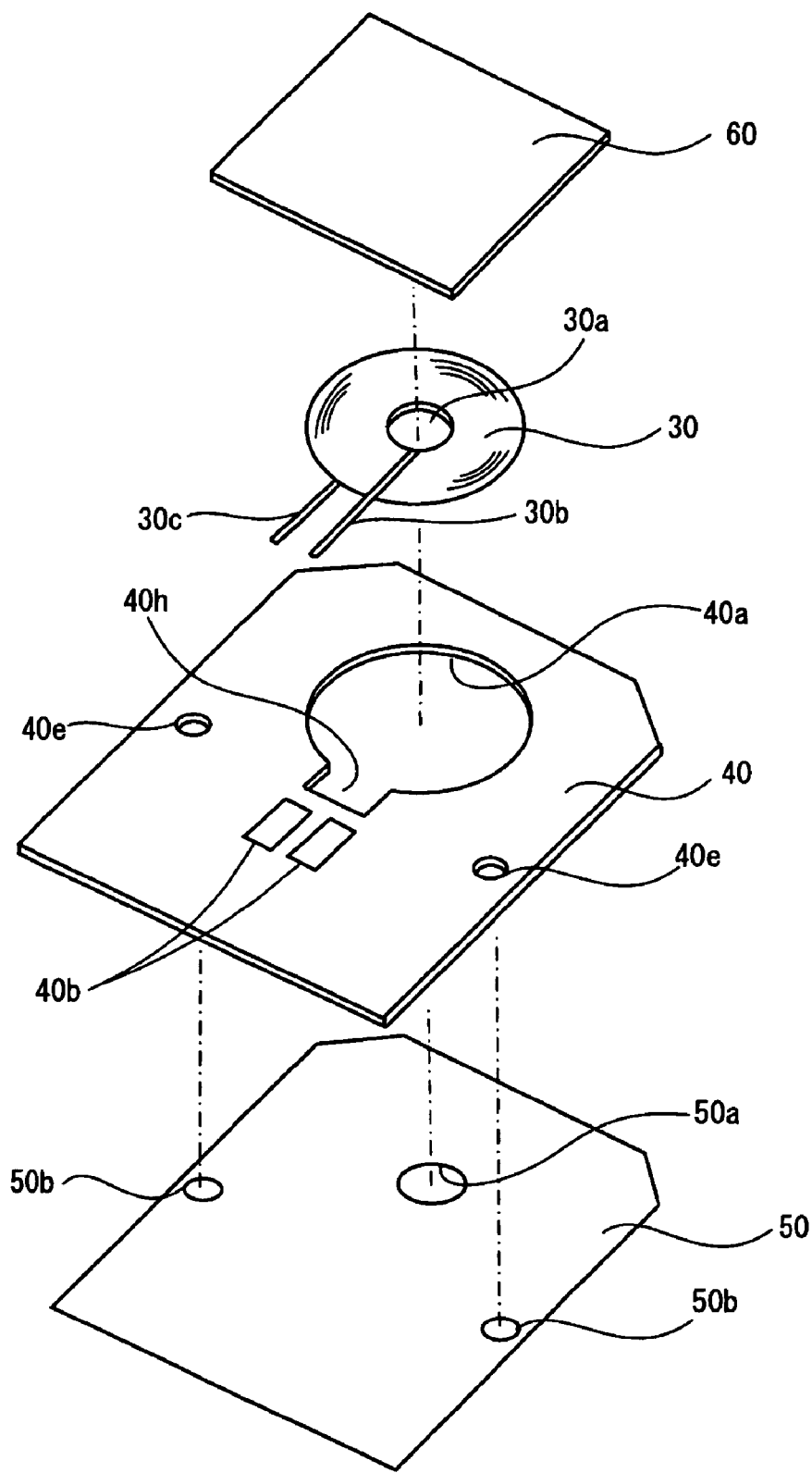
FIG. 3 is an exploded oblique view schematically showing a coil unit.
Figure 4:
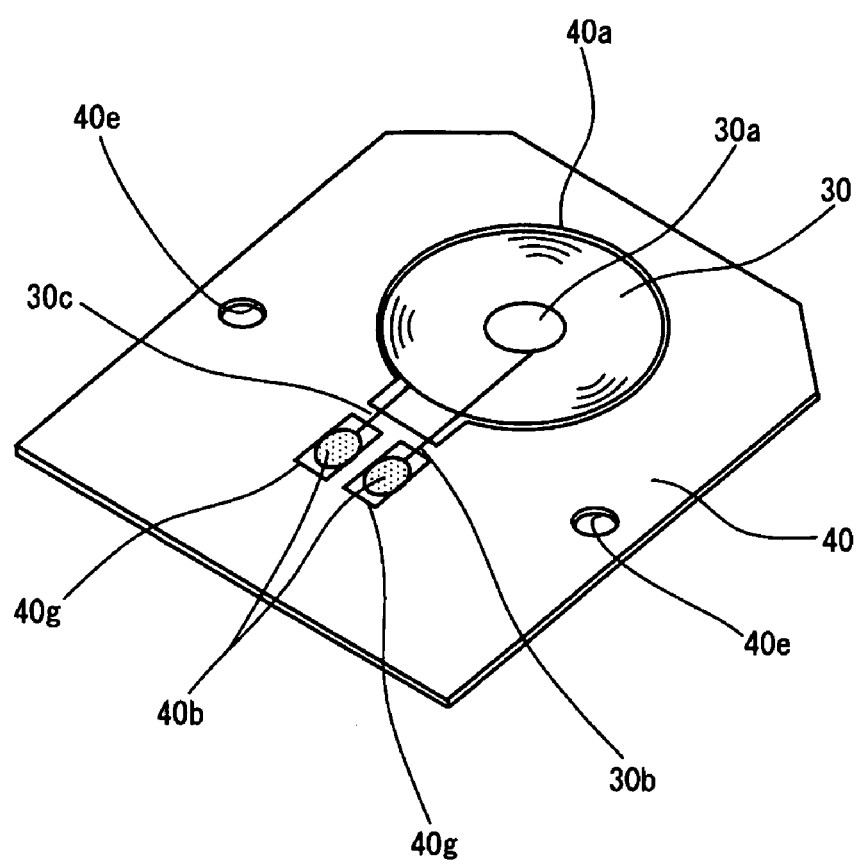
FIG. 4 is a view schematically showing a planar coil and a printed circuit board.
Figure 5:
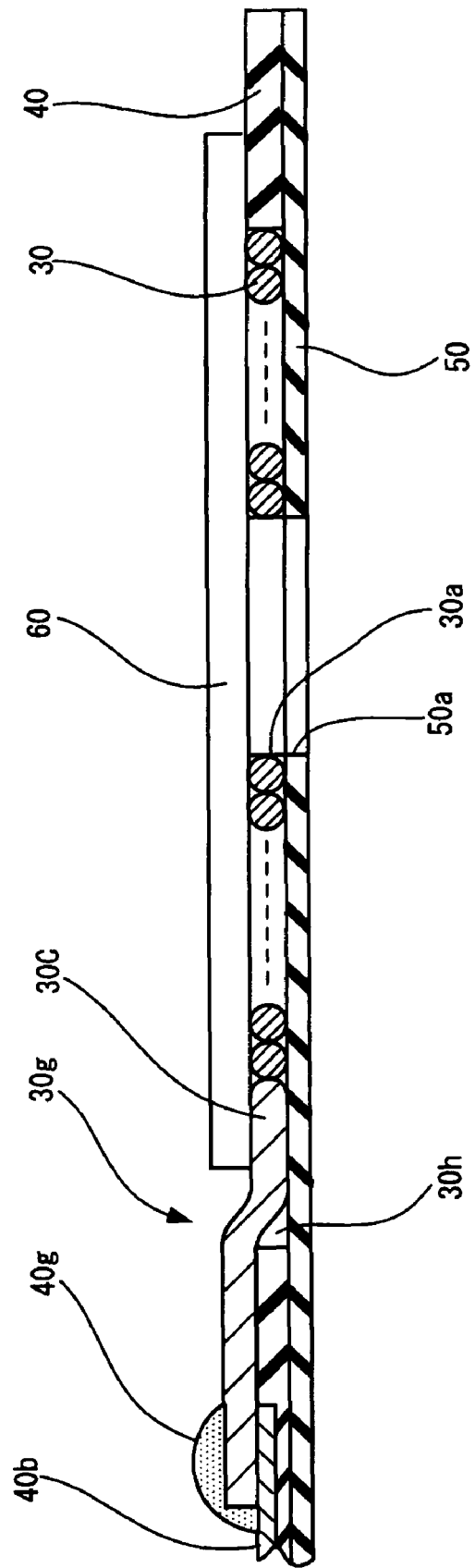
FIG. 5 is a cross-sectional view showing a coil unit.
Figure 6:
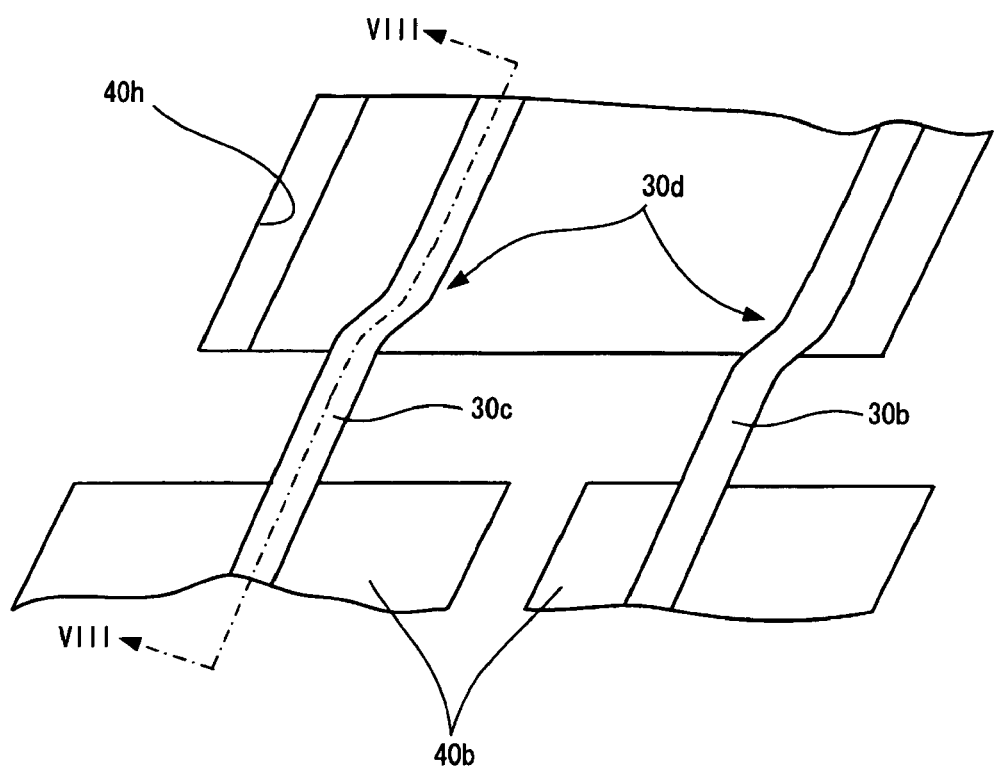
FIG. 6 is an enlarged view showing a coil lead line connection region 0.
Figure 7:
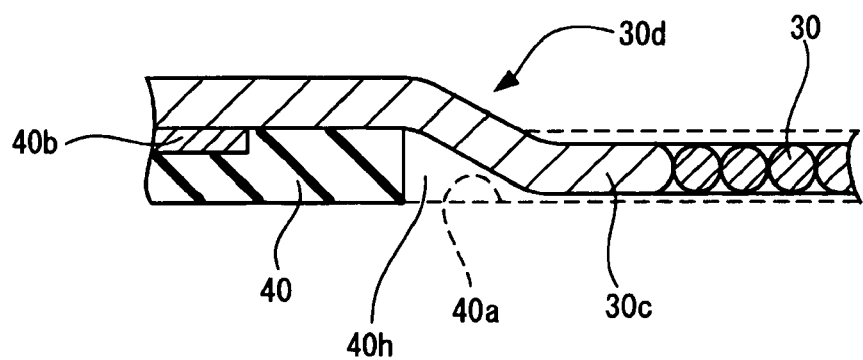
FIG. 7 is a view schematically showing a cross section along a line VIII-VIII shown in FIG. 6.

FIG. 2 is a view schematically showing the coil unit 22. FIG. 3 is an exploded oblique view schematically showing the coil unit 22. FIGS. 2 and 3 are views showing the coil unit 22 from a non-transmission side opposite to a transmission side through which the coil unit 22 faces the coil unit 12 in FIG. 1. The term "transmission side" refers to a side through which the coil unit 12 faces the coil unit 22, as shown in FIG. 1. FIG. 4 is a view schematically showing a planar coil 30 and a printed circuit board 40 from the non-transmission side. The term "non-transmission side" refers to a side of the coil units 12 and 22 opposite to the transmission side. FIG. 5 is a cross-sectional view showing the coil unit 22. FIG. 6 is an enlarged view showing a coil lead line connection region 0. FIG. 7 is a view schematically showing a cross section along the line VIII-VIII shown in FIG. 6.

The coil unit 22 may include the planar coil 30, the printed circuit board 40, a protective sheet 50, and a magnetic sheet 60. As shown in FIG. 4, the planar coil 30 is placed in a planar coil placement section 40a formed in the printed circuit board 40. The planar coil placement section 40a includes a hole formed through the printed circuit board 40 in the thickness direction. The protective sheet 50 which protects the planar coil 30 and the printed circuit board 40 is provided on the transmission side of the printed circuit board 40. The magnetic sheet 60 is provided on the non-transmission side of the planar coil 30.

Each element is described in detail below.

The planar coil 30 is not particularly limited insofar as the planar coil 30 is a flat (planar) coil. For example, an air-core coil formed by winding a single-core or multi-core coated coil wire in a plane may be applied as the planar coil 30. The coil unit according to one embodiment of the invention is described below taking the planar coil 30 having an air-core section 30a (see FIGS. 3 and 4) as an example.

The planar coil 30 is placed in the planar coil placement section 40a formed in the printed circuit board 40, as described above. The thickness of the coil unit can be reduced by the thickness of the planar coil 30 by placing the planar coil 30 in the planar coil placement section 40a. Moreover, the transmission side of the planar coil 30 and its peripheral surface can be easily made flush by placing the planar coil 30 in the planar coil placement section 40a. According to this embodiment, the protective sheet 50 does not undergo elevations or depressions. The planar coil placement section 40a has a shape corresponding to the external shape of the planar coil 30. Therefore, the planar coil 30 can be positioned with respect to the printed circuit board 40 by merely placing the planar coil 30 in the planar coil placement section 40a, whereby positioning is facilitated.

The planar coil 30 has a coil inner terminal lead line 30b which withdraws an inner terminal of the coil, and a coil outer terminal lead line 30c which withdraws an outer terminal of the coil. As shown in FIGS. 3 and 4, it is preferable that the coil inner terminal lead line 30b be provided over the non-transmission side of the planar coil 30. Since elevations do not occur on the transmission side by providing the coil inner terminal lead line 30b over the non-transmission side, the transmission side can be made flush. Moreover, transmission efficiency can be increased.

The printed circuit board 40 is provided with various mounted components used to drive the coil and wires which electrically connect the mounted components. It is preferable that the printed circuit board 40 be a rigid board rather than a flexible board because the planar coil placement section 40a can have a constant depth.

A lead line placement section 40h is provided in the printed circuit board 40 continuously with the planar coil placement section 40a (see FIG. 3). As shown in FIGS. 6 and 7, the lead line placement section 40h receives the coil inner terminal lead line 30b and the coil outer terminal lead line 30c of the planar coil 30. Since the lead lines 30b and 30c are provided in the lead line placement section 40h, the thickness of the coil unit can be reduced in that region by the thickness of the lead lines 30b and 30c. As shown in FIG. 7, since the lead lines 30b and 30c (FIG. 7 shows only the lead line 30c) are relatively gently bent in the lead line placement section 40h and then run onto the wiring circuit board 40, breakage rarely occurs.

The coil inner terminal lead line 30b and the coil outer terminal lead line 30c are provided to reach contact electrodes 40b, and are electrically connected to a pattern on the printed circuit board 40 through soldering sections 40g, as shown in FIGS. 2 and 5. The contact electrodes 40b are provided on the non-transmission side (front side in FIGS. 2 and 5) of the printed circuit board 40. As shown in FIG. 7, the coil inner terminal lead line 30b and the coil outer terminal lead line 30c are provided in the lead line placement section 40a of the printed circuit board 40, and have bent portions 30d so that the coil inner terminal lead line 30b and the coil outer terminal lead line 30c can run onto the printed circuit board 40.

Figure 8:
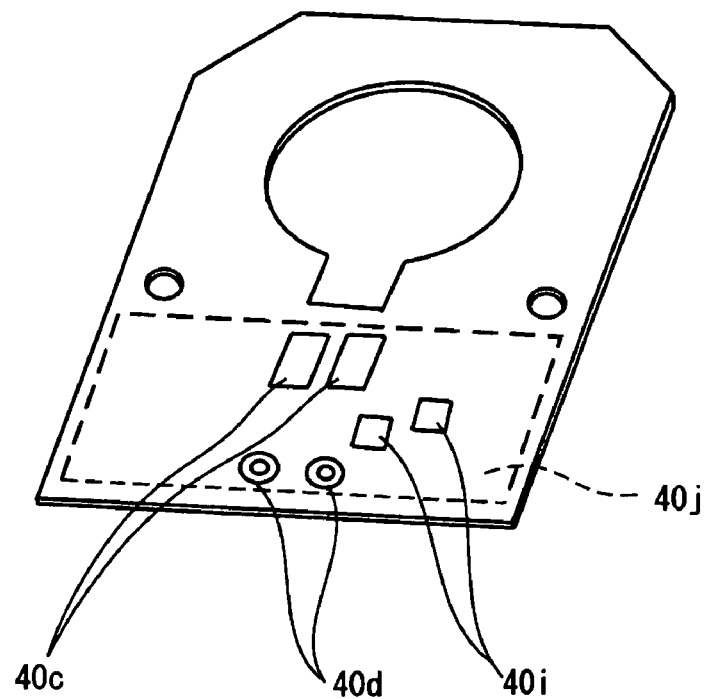
FIG. 8 is a view illustrative of a mounted circuit region of a printed circuit board.
Figure 9:
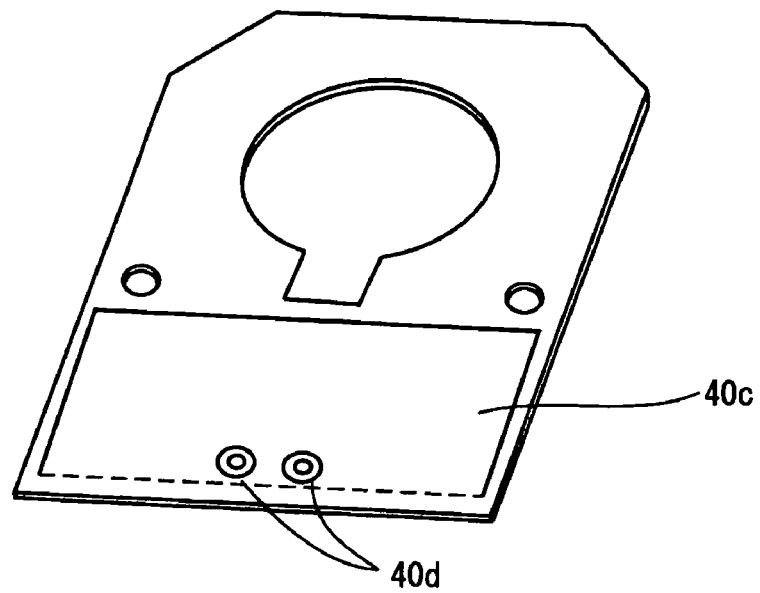
FIG. 9 is a view illustrative of a common electrode of a printed circuit board.

As shown in FIG. 8 which illustrates the wiring circuit board 40 from the non-transmission side, a region in which the contact electrodes 40b are provided corresponds to a mounted circuit region 40j. Effects on the transmission characteristics can be prevented by providing the mounted circuit region 40j apart from the planar coil placement section 40a. Since the mounted circuit region 40j is provided on the non-transmission side, elevations or depressions do not occur on the transmission side. The mounted circuit region 40j includes mounted components 40i which drive the planar coil 30 and the like. As shown in FIG. 9 which illustrates the wiring circuit board 40 from the transmission side, the mounted circuits provided in the mounted circuit region 40j are electrically connected to a common ground electrode surface 40c. A ground area can be provided while effectively utilizing the space on the transmission side of the printed circuit board 40 by providing the common ground electrode surface 40c on the transmission side, whereby the ground potential can be stabilized. Since components are not mounted on the common ground electrode surface 40c, the transmission side of the printed circuit board 40 can be made flat. Effects on the transmission characteristics are reduced by forming the common ground electrode surface 40c in the same region as the mounted circuit region 40j for the same reason as for the mounted circuit region 40j.

Figure 10:
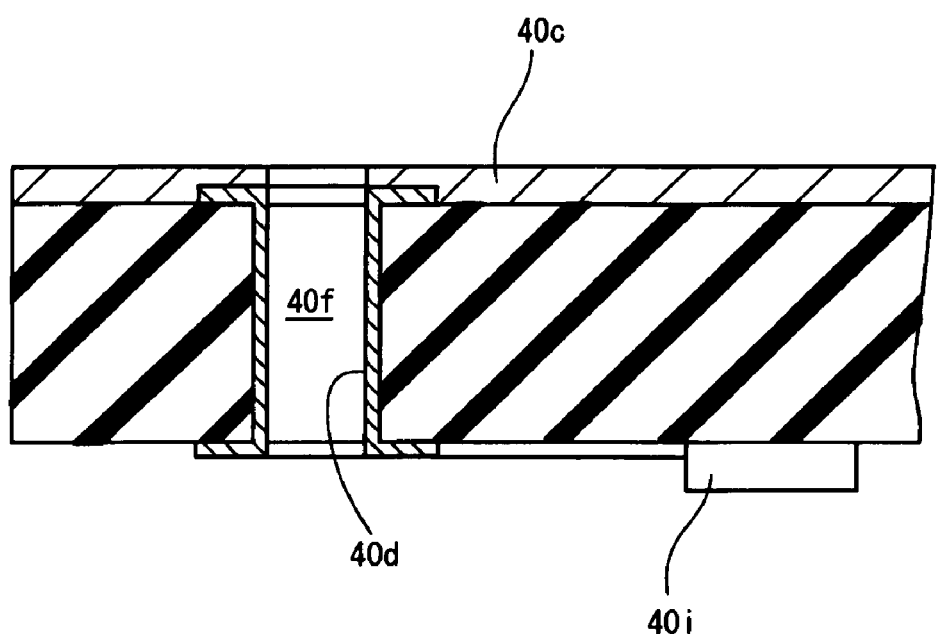
FIG. 10 is a view schematically showing a cross section of a contact section of a printed circuit board.

As shown in FIG. 10, the common ground electrode surface 40c is electrically connected to a wire which is connected to the mounted component 40i through a contact section 40d provided in a through-hole 40f.

Since the module according to this embodiment has a small circuit scale, only the ground pattern is formed on the transmission side of the printed circuit board 40. Note that a pattern other than the ground pattern may also be formed when the module according to this embodiment has a large circuit scale.

A plurality of (e.g., two) positioning holes (second positioning holes) 40e used for positioning with respect to the protective sheet 50 are formed in the printed circuit board 40. The mounted circuit region 40j may be provided on a board other than the printed circuit board 40 which receives the planar coil 30.

The protective sheet 50 is a sheet which protects at least the planar coil 30. In this embodiment, the protective sheet 50 is formed to cover the entire transmission side of the printed circuit board 40 and the planar coil 30. The protective sheet 50 is not particularly limited insofar as the protective sheet 50 has insulating properties. As shown in FIG. 3, the protective sheet 50 has a positioning hole (first positioning hole) 50a formed at a position corresponding to the air-core section 30a of the planar coil 30. The planar coil 30 and the protective sheet 50 can be easily positioned by forming the positioning hole 50a in the protective sheet 50 at a position corresponding to the air-core section 30a. As shown in FIG. 3, the protective sheet 50 has a positioning hole (third positioning hole) 50b at a position corresponding to the positioning hole 40e of the printed circuit board 40. The printed circuit board 40 and the protective sheet 50 can be easily positioned utilizing the positioning holes 40e and 50b.

It is preferable that the protective sheet 50 be a heat sink sheet formed of a material having a thermal conductivity equal to or higher than 1 W/mK (i.e., thermal conductivity of glass). For example, a PGS graphite sheet manufactured by Matsushita Electric Industrial Co., Ltd. has a high thermal conductivity of 600 W/mK (i.e., twice to four times the thermal conductivity of copper and three to six times the thermal conductivity of aluminum). The protective sheet 50 can be utilized as a heat sink sheet using this type of material so that heat generated from the planar coil 30 can be dissipated through the protective sheet 50 which adheres to the planar coil 30. In particular, since the transmission side adheres to an external casing of a product, it is possible to reduce the thermal resistance of a heat sink path connected to the external casing through the protective sheet 50 which adheres to the transmission side of the coil 30. On the other hand, since components (e.g., battery and crystal) affected by an increase in temperature are provided on the non-transmission side, the main heat sink path is provided on the transmission side.

As a battery disposed on the non-transmission side, a secondary battery is normally used when using a power transmission system. The charging temperature of a lithium ion secondary battery or a lithium polymer secondary battery which has been widely used for portable telephones, MPEG players, and the like is specified at about 45° C. or less in view of its characteristics. When charging such a battery at a temperature higher than about 45° C., the battery deteriorates due to gas produced inside the battery. In the worst case, an explosion may occur. Therefore, it is necessary to suppress heat generation during charging. In this embodiment, an increase in temperature on the non-transmission side is suppressed utilizing the protective sheet 50 as a heat sink path.

The transmission side can be made flush by withdrawing the inner terminal of the planar coil 30 over the non-transmission side, whereby the adhesion between the planar coil 30 and the protective sheet (heat sink sheet) 50 increases. As a result, contact thermal resistance is reduced, whereby heat is easily dissipated.

In this embodiment, the protective sheet 50 has the same external shape as the printed circuit board 40. Note that the invention is not limited thereto. The protective sheet 50 may be formed to have such a shape (area) that the contact area with the inner shape (area) of an external casing which contacts the transmission side of the coil unit is maximized. This further increases the heat sink effect.

The magnetic sheet 60 receives a magnetic flux from the planar coil 30, and increases the inductance of the planar coil 30. A soft magnetic material is preferably used as the material for the magnetic sheet 60. A soft magnetic ferrite material or a soft magnetic metal material may be used as the material for the magnetic sheet 60.

In the coil unit 22 of the portable telephone 20, a magnetic flux leakage prevention member (not shown) may optionally be provided on the side of the magnetic sheet 60 opposite to the side through which the magnetic sheet 60 faces the air-core planar coil 30. The magnetic flux leakage prevention member absorbs a magnetic flux which cannot be absorbed by the magnetic sheet 60 or leaks from the magnetic sheet 60. This prevents an adverse effect of a magnetic flux on the components provided in the portable telephone 20. The material for the magnetic flux leakage prevention member is not particularly limited insofar as the material can absorb a magnetic flux. For example, a non-magnetic material such as aluminum may be used as the material for the magnetic flux leakage prevention member. The transmission characteristics are affected by a member formed under the magnetic sheet 60 in contact with the magnetic sheet 60. Therefore, it is preferable to specify the material and size of the magnetic flux leakage prevention member depending on the desired transmission characteristics.

The printed circuit board 40 and the planar coil 30 may be bonded to the protective sheet 50 and the magnetic sheet 60 using a double-sided tape or the like.

3. Method of Manufacturing Coil Unit

Figure 11:
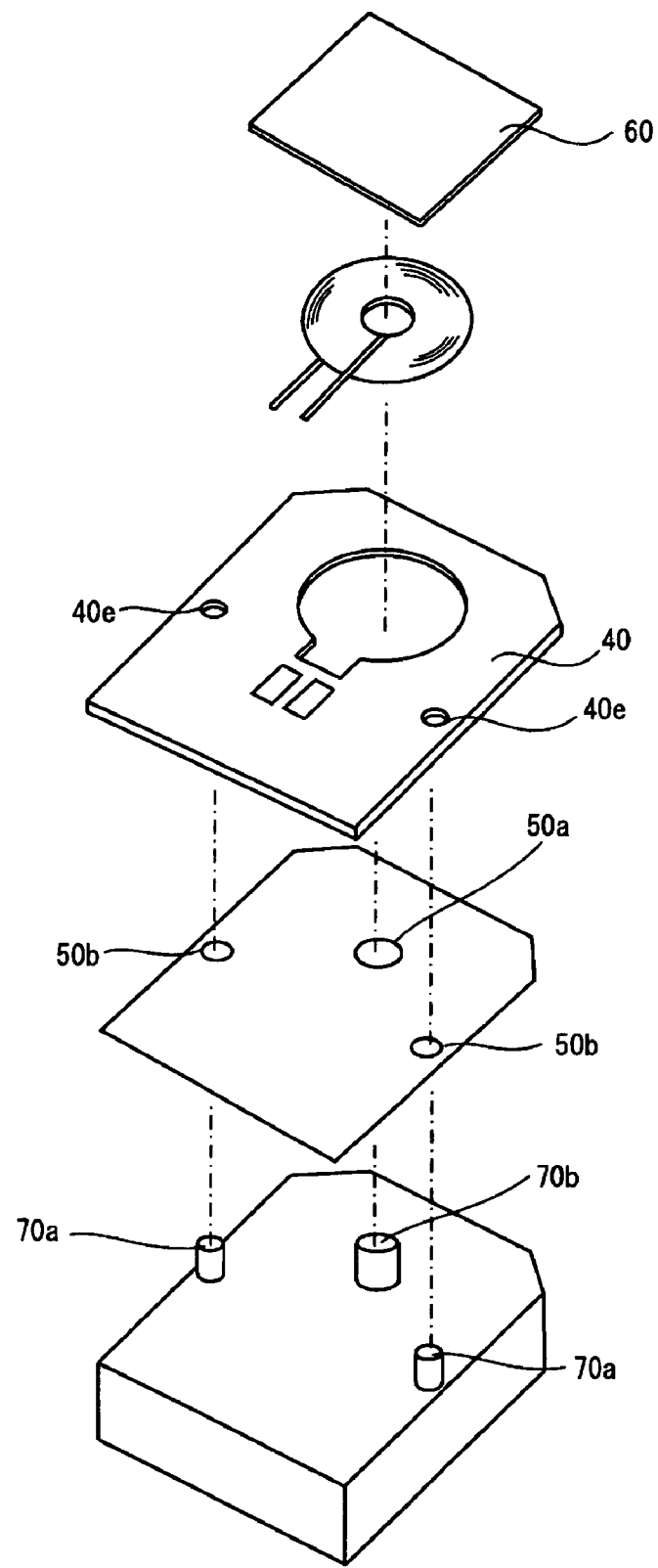
FIG. 11 is a view schematically showing a step of manufacturing a coil unit.
Figure 12:
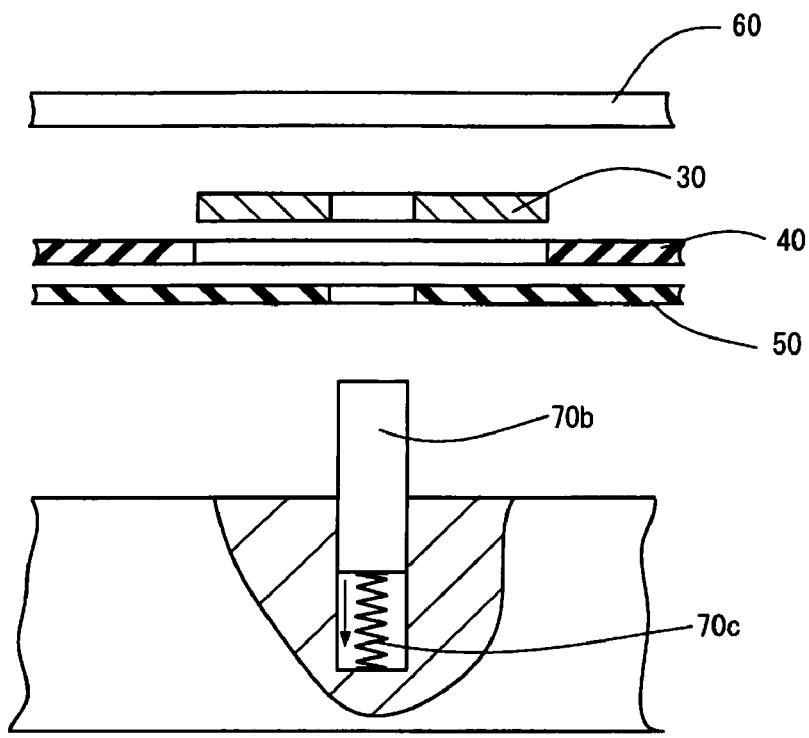
FIG. 12 is another view schematically showing a step of manufacturing a coil unit.
Figure 13:
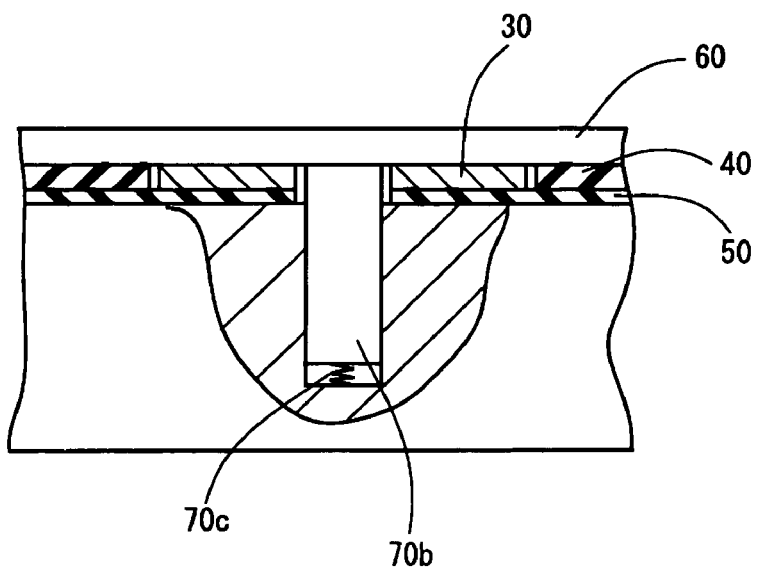
FIG. 13 is a further view schematically showing a step of manufacturing a coil unit.

A method of manufacturing a coil unit is described below. FIGS. 11 to 13 are views illustrative of the method of manufacturing a coil unit.

An assembly jig 70 is provided. The assembly jig 70 has a plurality of (e.g., two) first positioning protrusions 70a and a second positioning protrusion 70b.

The protective sheet 50 is placed on the assembly jig 70. The protective sheet 50 is positioned with respect to the assembly jig 70 by inserting the first and second positioning protrusions 70a and 70b of the assembly jig 70 into the positioning holes 50b and 50a.

The printed circuit board 40 is then placed on the assembly jig 70. The printed circuit board 40 is positioned with respect to the assembly jig 70 by inserting the first positioning protrusions 70a of the assembly jig 70 into the positioning holes 40e of the printed circuit board 40.

The planar coil 30 is then placed on the assembly jig 70. The planar coil 30 is placed on the assembly jig 70 so that the planar coil 30 is placed in the planar coil placement section 40a in the printed circuit board 40. Since the planar coil placement section 40a has a shape corresponding to the external shape of the planar coil 30, the planar coil placement section 40a has a function of a positioning section for the planar coil 30. The planar coil 30 is positioned with respect to the assembly jig 70 by inserting the second positioning protrusion 70b of the assembly jig 70 into the air-core section 30a of the planar coil 30.

The magnetic sheet 60 is then placed on the planar coil 30 and the printed circuit board 40. The protective sheet 50 and the magnetic sheet 60 are bonded to the printed circuit board 40 and the planar coil 30 by pressing the magnetic sheet 60. The coil unit 22 is thus formed. The protective sheet 50 and the magnetic sheet 60 may be bonded to the printed circuit board 40 and the planar coil 30 by providing double-sided adhesive tapes (not shown) between the protective sheet 50 and the printed circuit board 40 and between the planar coil 30 and the magnetic sheet 60, for example.

As shown in FIGS. 12 and 13, it is preferable that the second positioning protrusion 70b be biased in the protruding direction using a coil spring 70c or the like so that the second positioning protrusion 70b can advance or withdraw with respect to the assembly jig 70. According to this configuration, the protective sheet 50 and the coil 30 can be easily positioned during assembly by ensuring that the second positioning protrusion 70b has a sufficient height. Moreover, the second positioning protrusion 70b can be caused to descend due to pressure applied when bonding the magnetic sheet 60 (see FIG. 13).

The terminal lead lines 30b and 30c of the planar coil 30 are then electrically connected to the contact electrodes 40b of the printed circuit board 40 by soldering or the like. The soldering step may be carried out before placing the magnetic sheet 60.

(Application Example of Electronic Instrument)

The above embodiments may be applied to an electronic instrument which performs power transmission or signal transmission. For example, the above embodiments may be applied to a charging target instrument including a secondary battery (e.g., wristwatch, electric toothbrush, electric shaver, cordless telephone, personal handyphone, mobile personal computer, personal digital assistant (PDA), or power-assisted bicycle) and a charging instrument. Since the electronic instrument according to this embodiment has a configuration in which the size of the coil unit can be easily reduced, the size of the electronic instrument can also be easily reduced. Since the planar coil is provided in the coil unit, the planar coil can be easily incorporated in the electronic instrument.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term cited with a different term having a broader meaning or the same meaning at least once in the specification and the drawings can be replaced by the different term in any place in the specification and the drawings.

The above embodiments have been described taking an example of non-contact power transmission. Note that the invention may be similarly applied to non-contact signal transmission utilizing an electromagnetic induction principle.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention.

What is claimed is:

1. A coil unit comprising:
   a planar coil having a transmission side and a non-transmission side;
   a printed circuit board that includes a planar coil placement section that receives the planar coil so as to reduce a thickness of the coil unit by a thickness of the planar coil; and
   a magnetic sheet that is provided on the non-transmission side of the planar coil,
   the planar coil placement section being a first hole formed through the printed circuit board in a thickness direction, the hole having a shape that corresponds to an external shape of the planar coil,
   the planar coil being formed by winding a coated coil wire in a plane and having an air-core section, an inner terminal, an outer terminal, a first lead line connected to the inner terminal and a second lead line connected to the outer terminal,
   the first lead line being provided over the non-transmission side of the planar coil,
   the printed circuit board having a lead line placement section that receives the first lead line and the second lead line, the lead line placement section being a second hole formed through the printed circuit board in the thickness direction, the second hole of the lead line placement section being continuous with the first hole of the planar coil placement section, and the printed circuit board having a first electrode and a second electrode on a surface that is the same side as the non-transmission side of the planar coil, the first electrode being connected to the first lead line and the second electrode being connected to the second lead line.

2. The coil unit as defined in claim 1, further comprising a protective sheet that is provided on the transmission side of the planar coil and protects the planar coil, the protective sheet having a first positioning hole that is formed at a position corresponding to the air-core section of the planar coil.

3. The coil unit as defined in claim 2, the printed circuit board having a second positioning hole; and the protective sheet having a third positioning hole that is formed at a position corresponding to the second positioning hole.

4. The coil unit as defined in claim 1, further comprising a protective sheet that is provided on the transmission side of the planar coil and protects the planar coil, the protective sheet being a heat sink sheet that has a thermal conductivity of 1 WmK or more.

5. The coil unit as defined in claim 1, a mounted circuit being provided on a non-transmission side of the printed circuit board.

6. The coil unit as defined in claim 5, a common ground electrode surface being formed on a transmission side of the printed circuit board, the common ground electrode surface being electrically connected to the mounted circuit.

7. An electronic instrument comprising the coil unit as defined in claim 1.

* * * * *